(12) United States Patent
Cha et al.

(10) Patent No.: US 9,825,014 B2
(45) Date of Patent: Nov. 21, 2017

(54) LIGHT SOURCE MODULE, DISPLAY PANEL, AND DISPLAY APPARATUS INCLUDING THE SAME

(71) Applicant: Samsung Electronics Co., Ltd., Suwon-si, Gyeonggi-do (KR)

(72) Inventors: Nam Goo Cha, Hwaseong-si (KR); Yong Ii Kim, Seoul (KR); Wan tae Lim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/226,209

(22) Filed: Aug. 2, 2016

(65) Prior Publication Data

US 2017/0148771 A1 May 25, 2017

(30) Foreign Application Priority Data

Nov. 19, 2015 (KR) .................. 10-2015-0162778

(51) Int. Cl.
| | |
|---|---|
| *H01L 33/60* | (2010.01) |
| *H01L 33/48* | (2010.01) |
| *H01L 25/075* | (2006.01) |
| *H01L 33/62* | (2010.01) |
| *H01L 33/20* | (2010.01) |
| *H01L 33/38* | (2010.01) |
| *H05K 1/00* | (2006.01) |
| *H01L 33/50* | (2010.01) |

(52) U.S. Cl.
CPC .......... *H01L 25/0753* (2013.01); *H01L 33/20* (2013.01); *H01L 33/38* (2013.01); *H01L 33/62* (2013.01); *H05K 1/00* (2013.01); *H01L 33/505* (2013.01)

(58) Field of Classification Search
CPC ..... H01L 25/0753; H01L 33/20; H01L 33/38; H01L 33/62; H01L 33/505; H01K 1/00
USPC ................ 257/79, 88, 98, 99, 103, E23.061, 257/E23.193, E21.499; 118/504, 505, 118/721; 313/326, 512; 438/27
See application file for complete search history.

(56) References Cited

U.S. PATENT DOCUMENTS

| | | | |
|---|---|---|---|
| 5,355,577 A | 10/1994 | Cohn | |
| 6,372,608 B1 | 4/2002 | Shimoda et al. | |
| 6,475,287 B1 * | 11/2002 | Clark | ................... C23C 14/042 118/504 |
| 6,645,830 B2 | 11/2003 | Shimoda et al. | |
| RE38,466 E | 3/2004 | Inoue et al. | |
| 6,749,690 B2 | 6/2004 | Clark | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |

(Continued)

*Primary Examiner* — Dao H Nguyen
(74) *Attorney, Agent, or Firm* — Harness, Dickey & Pierce, P.L.C.

(57) ABSTRACT

A light source module includes a circuit board having a plurality of chip mounting regions, the plurality of chip mounting regions respectively having at least one connection pad; at least one alignment component respectively disposed on the plurality of chip mounting regions, and having a convex or concave shape; and a plurality of LED chips respectively mounted on the plurality of chip mounting regions, respectively having at least one electrode electrically connected to the at least one connection pad, and respectively coupled to the at least one alignment component.

19 Claims, 15 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,888,140 B2 | 2/2011 | Lian et al. |
| 7,940,350 B2 | 5/2011 | Jeong |
| 7,943,052 B2 | 5/2011 | Wu et al. |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,333,860 B1 | 12/2012 | Bibl et al. |
| 8,349,116 B1 | 1/2013 | Bibl et al. |
| 8,383,506 B1 | 2/2013 | Golda et al. |
| 8,399,944 B2 | 3/2013 | Kwak et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,426,227 B1 | 4/2013 | Bibl et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,569,115 B1 | 10/2013 | Golda et al. |
| 8,586,410 B2 | 11/2013 | Arnold et al. |
| 8,735,931 B2 | 5/2014 | Han et al. |
| 8,766,295 B2 | 7/2014 | Kim |
| 8,791,474 B1 | 7/2014 | Bibl et al. |
| 9,105,714 B2 | 8/2015 | Hu et al. |
| 2003/0201462 A1* | 10/2003 | Pommer ............... G02B 6/4201 257/200 |
| 2010/0219156 A1 | 9/2010 | Hipwell, Jr. et al. |
| 2012/0112622 A1* | 5/2012 | Suzuki ................... H01L 33/38 313/326 |
| 2013/0126081 A1 | 5/2013 | Hu et al. |
| 2013/0126098 A1 | 5/2013 | Bibl et al. |
| 2013/0126589 A1 | 5/2013 | Bibl et al. |
| 2013/0126827 A1 | 5/2013 | Bibl et al. |
| 2013/0126891 A1 | 5/2013 | Bibl et al. |
| 2013/0127020 A1 | 5/2013 | Bibl et al. |
| 2013/0128585 A1 | 5/2013 | Bibl et al. |
| 2013/0130440 A1 | 5/2013 | Hu et al. |
| 2013/0300812 A1 | 11/2013 | Bibl et al. |
| 2013/0316529 A1 | 11/2013 | Golda et al. |
| 2014/0008813 A1 | 1/2014 | Golda et al. |
| 2014/0027709 A1 | 1/2014 | Higginson et al. |
| 2014/0048909 A1 | 2/2014 | Golda et al. |
| 2014/0064904 A1 | 3/2014 | Bibl et al. |
| 2014/0084240 A1 | 3/2014 | Hu et al. |
| 2014/0084482 A1 | 3/2014 | Hu et al. |
| 2014/0159043 A1 | 6/2014 | Sakariya et al. |
| 2014/0196851 A1 | 7/2014 | Golda et al. |
| 2014/0209248 A1 | 7/2014 | Golda et al. |
| 2014/0241844 A1 | 8/2014 | Golda et al. |
| 2014/0299572 A1 | 10/2014 | Bibl et al. |
| 2014/0346549 A1* | 11/2014 | Choi ..................... H01L 33/505 257/98 |
| 2014/0367633 A1 | 12/2014 | Bibl et al. |
| 2014/0367705 A1 | 12/2014 | Bibl et al. |
| 2014/0367711 A1 | 12/2014 | Bibl et al. |
| 2015/0008389 A1 | 1/2015 | Hu et al. |
| 2015/0028362 A1 | 1/2015 | Chan et al. |
| 2016/0107178 A1* | 4/2016 | Velasquez-Garcia ..... B05B 1/14 239/3 |
| 2017/0025395 A1* | 1/2017 | Chen ................... H01L 25/0753 |

* cited by examiner

LIGHT SOURCE MODULE, DISPLAY PANEL, AND DISPLAY APPARATUS INCLUDING THE SAME

CROSS-REFERENCE TO RELATED APPLICATION

This application claims benefit of priority to Korean Patent Application No. 10-2015-0162778, filed on Nov. 19, 2015 with the Korean Intellectual Property Office, the disclosure of which is incorporated herein by reference in its entirety.

BACKGROUND

The present inventive concepts relate to light source modules, display panels, and display apparatuses including one or more of the same.

Semiconductor light emitting diode (LED) devices have been used as light sources for various electronic products, as well as light sources for lighting devices. In particular, semiconductor LED devices are widely being used as light sources for various types of display devices such as TVs, mobile phones, PCs, laptop PCs, and PDAs.

Some display devices include display panels, commonly liquid crystal display (LCD) panels, as well as backlight units; however, recently, display devices which do not require additional backlights through using an LED device as a single pixel have been under development. Some display devices may be relatively compact, and may be implemented as high brightness displays with improved optical efficiency as compared to conventional LCDs. Display devices may also allow an aspect ratio of a display image to be freely changed, and may be implemented as large display devices, thereby providing various forms of large displays.

When such LED display panels are manufactured, LED chips may be required to be aligned in a matrix arrangement on a circuit board. But such an arrangement may be difficult to implement with precision. In particular, LED chips may be made smaller into micro LED chips, and such an arrangement may cause a defect or an increased transfer process time.

SUMMARY

Some aspects of the inventive concepts may provide one or more of a light source module, a display panel, and a display apparatus including one or more of the same. Some aspects of the inventive concepts may improve accuracy of an alignment position when an LED chip is aligned on a circuit board.

According to some example embodiments, a light source module may include: a circuit board including at least one chip mounting region, of the at least one chip mounting region including at least one connection pad; at least one alignment component on the at least one chip mounting region, the at least one alignment component including a convex shape or a concave shape; and at least one light emitting diode (LED) chip on the at least one chip mounting region, the at least one LED chip including at least one electrode, the at least one electrode configured to be electrically connected to the at least one connection pad of the at least one chip mounting region, the at least one LED chip being coupled to at least one alignment component of the at least one chip mounting region.

The at least one alignment component may include the convex shape, and the at least one LED chip may include at least one alignment recess, the at least one alignment recess being configured to be coupled to the at least one alignment component of the at least one chip mounting region.

Alignment components may be on respective edges of the at least one chip mounting region.

The at least one LED chip may include a light transmitting substrate and a semiconductor stack on the light transmitting substrate. The at least one alignment recess may extend from points on edges of the light transmitting substrate of the at least one LED chip to points on edges of the light transmitting substrate of the at least one LED chip adjacent thereto in the semiconductor stack of the at least one LED chip.

The at least one LED chip may further include at least one alignment pad on the at least one alignment recess.

At least one of the at least one alignment component and the at least one alignment pad may include a magnetic body.

At least one of the at least one connection pad and the at least one electrode may include a magnetic body.

The light source module may further include a reflective guide layer on the circuit board and surrounding the at least one LED chip.

The at least one LED chip may have an area that is less than or equal to 200 $\mu m^2$.

According to some example embodiments, an LED display panel may include: a circuit board including a at least one pixel region, the at least one pixel region including at least one chip mounting region, the at least one chip mounting region including at least one connection pad; at least one alignment component on the at least one chip mounting region, the at least one alignment component including a convex shape or a concave shape; and at least one LED chip on the at least one chip mounting region. The at least one LED chip may include at least one electrode configured to be electrically connected to the at least one connection pad of the at least one chip mounting region, and the at least one LED chip may be configured to be coupled to the at least one alignment component of the at least one chip mounting region.

The at least one alignment component may include at least one alignment post structure on at least one edge of at least one chip mounting region. The at least one LED chip may include at least one alignment recess configured to be coupled to at least one alignment post structure of the at least one chip mounting region, respectively.

The at least one LED chip may include a light transmitting substrate and a semiconductor stack on the light transmitting substrate. The at least one alignment recess may extend from points on edges of the light transmitting substrate of the at least one LED chip to points on edges of the light transmitting substrate of the at least one LED chip adjacent thereto in the semiconductor stack of the at least one LED chip.

The at least one LED chip may further include at least one alignment pad on the at least one alignment recess. At least one of the at least one alignment component and the at least one alignment pad may include a magnetic body.

At least one of the connection pad and the at least one electrode may include a magnetic body.

The at least one electrode may include at least one conductive magnetic body layer.

The at least one LED chip may include a first surface, and the at least one LED chip may be configured to be on the circuit board such that the first surface of the at least one LED chip is a proximate surface of the at least one LED chip, relative to the circuit board. The at least one connection pad may include a first connection pad and a second connection pad. The at least one electrode may be on the first surface. The at least one electrode may include a first electrode and a second electrode, the first electrode and the second electrode being configured to be connected to the first connection pad and the second connection pad, respectively.

The at least one LED chip may include a first surface, and the at least one LED chip may be configured to be on the circuit board such that the first surface of the at least one LED chip is a proximate surface of the at least one LED chip, relative to the circuit board. The at least one LED chip may include a second surface, the second surface being an opposing surface, relative to the first surface. The least one electrode may include a first electrode on the first surface. The at least one LED chip may further include a second electrode, the second electrode being on the second surface.

The LED display panel may further include an electrode wiring layer configured to interconnect the second electrodes of each LED chip of the at last one LED chip.

The LED display panel may further include a black matrix on the circuit board, the black matrix surrounding the at least one LED chip.

The circuit board may include a thin film transistor (TFT).

According to some example embodiments, an LED display apparatus may include: an LED display panel; a memory storing computer readable instructions; and a processor. The processor may be configured to execute the computer readable instructions to drive the LED display panel. The LED display panel may include: a circuit board including a at least one pixel region, the at least one pixel region including at least one chip mounting region, the at least one chip mounting region including at least one connection pad; at least one alignment component on the at least one chip mounting region, the at least one alignment component including a convex shape or a concave shape; and at least one LED chip on the at least one chip mounting region. The at least one LED chip may include at least one electrode configured to be electrically connected to the at least one connection pad of the at least one chip mounting region. The at least one LED chip may be configured to be coupled to the at least one alignment component of the at least one chip mounting region.

The at least one LED chip may have an area that is less than or equal to 200 µm².

According to some example embodiments, a light emitting diode (LED) chip may include: a light transmitting substrate; a semiconductor stack on the light transmitting substrate; and at least one electrode on at least a portion of the semiconductor stack. The at least one electrode may be configured to couple with at least one connection pad of a circuit board to form a complementary fit, such that: a sidewall of the at least one electrode is in flush contact with a sidewall of the at least one connection pad, and at least a portion of the at least one electrode is co-planar with at least one portion of the at least one connection pad.

The at least one electrode may include a magnetic body.

The at least one electrode may include at least one conductive magnetic body layer.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views.

The drawings are not necessarily to scale, emphasis instead being placed upon illustrating principles of inventive concepts. In the drawings.

DETAILED DESCRIPTION

Figure 1:
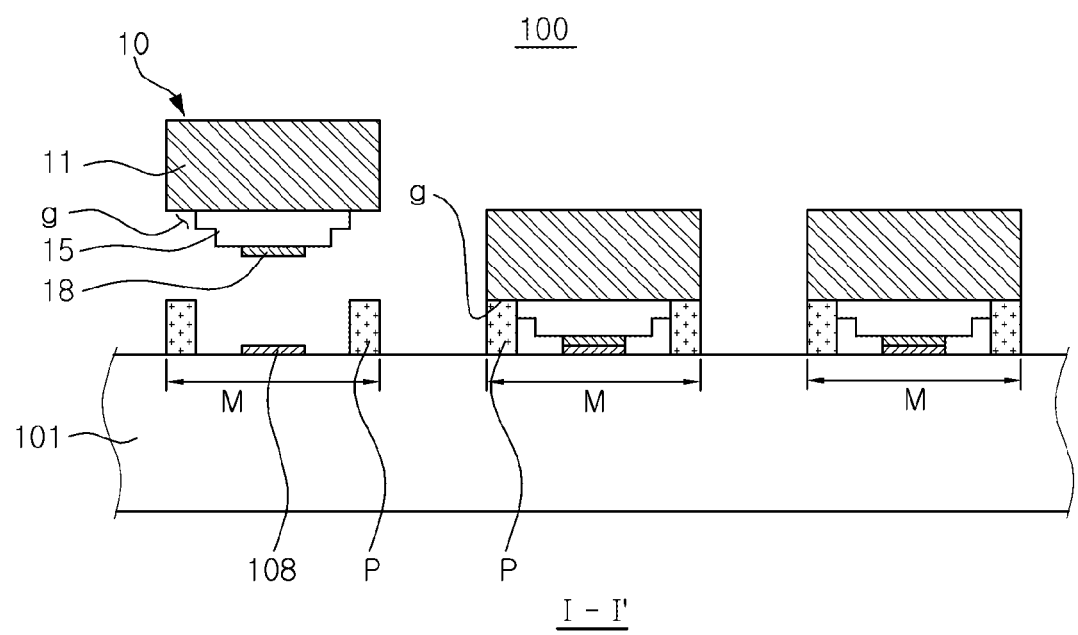
FIG. 1 is a cross-sectional view of a light source module according to some example embodiments of the inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
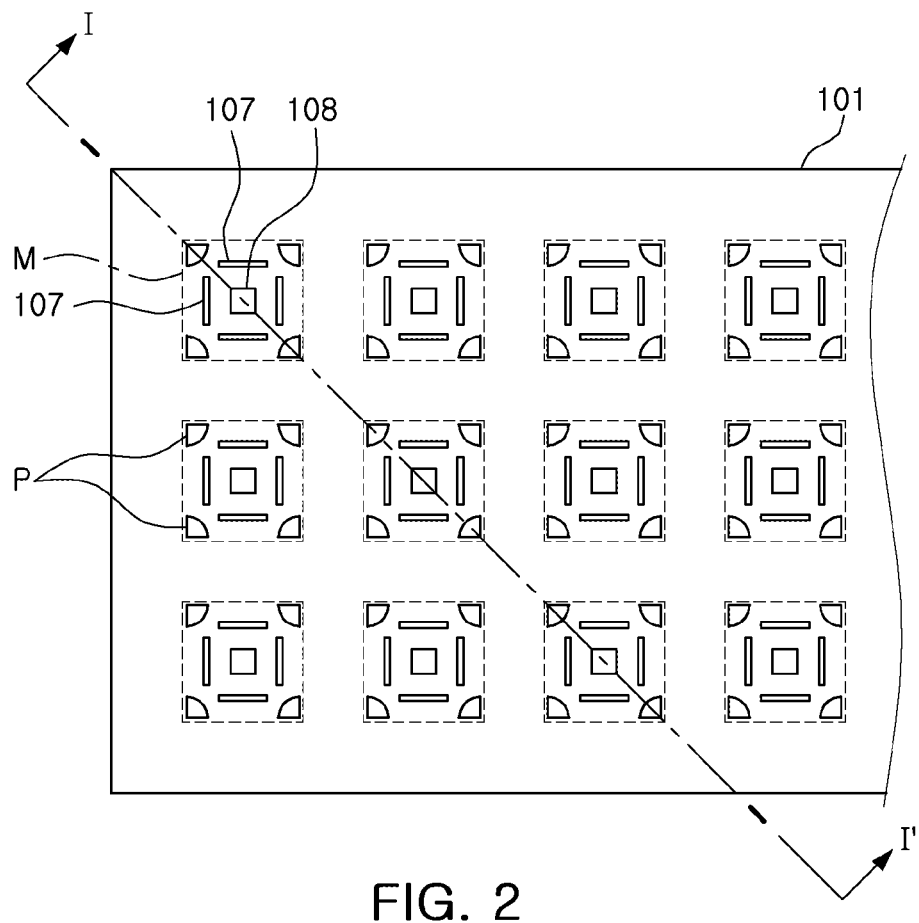
FIG. 2 is a plan view of a circuit board employed in the light source module illustrated in FIG. 1.

FIG. 1 is a cross-sectional view of a light source module according to some example embodiments of the inventive concepts, and FIG. 2 is a plan view of a circuit board employed in the light source module illustrated in FIG. 1. FIG. 1 is a cross-sectional view taken along line I-I' of the circuit board illustrated in FIG. 2.

Referring to FIG. 1, a light source module 100 according to some example embodiments may include a circuit board 101 and a plurality of light emitting diode (LED) chips 10 on the circuit board 101. The LED chips 10 may be mounted on the circuit board 101.

The circuit board 101 may have an upper surface on which a plurality of chip mounting regions M are arranged as illustrated in FIG. 2. Each of the chip mounting regions M may include one or more first connection pads 107 and at least one second connection pad 108 thereon. The first and second connection pads 107, 108 on a chip mounting region M may be connected to an electrode included in each of the LED chips 10. The circuit board 101 may include a circuit pattern connected to the first connection pads 107 and the second connection pad 108 to connect the plurality of LED chips 10 to each other in series and/or in parallel. For example, the circuit board 101 may include an organic resin material such as epoxy, triazine, silicone, or polyimide. In some example embodiments, the circuit board 101 may be a printed circuit board (PCB) of an FR4 type, or may be a flexible PCB easy to be deformed. In some example embodiments, the circuit board 101 may include a ceramic material such as silicon nitride, AlN, or $Al_2O_3$, or a metal or a metallic compound such as a metal core printed circuit board (MCPCB) or a metal copper clad laminate (MCCL).

A plurality of alignment components P may be disposed on each of the plurality of chip mounting regions M. The alignment components P may have convex post structures, respectively. As illustrated in FIG. 2, the alignment components P may be disposed on edges of each of the chip mounting regions M, for example, four corners, respectively. Each of the plurality of LED chips 10 may be coupled to the alignment components P. Portions of the structure in which each of the plurality of LED chips 10 are coupled to the alignment components P may be provided as alignment recesses g. The LED chips 10 and the chip mounting regions M employed in some example embodiments are illustrated in more detail in FIG. 3A and FIG. 3B, respectively.

Figure 3A:
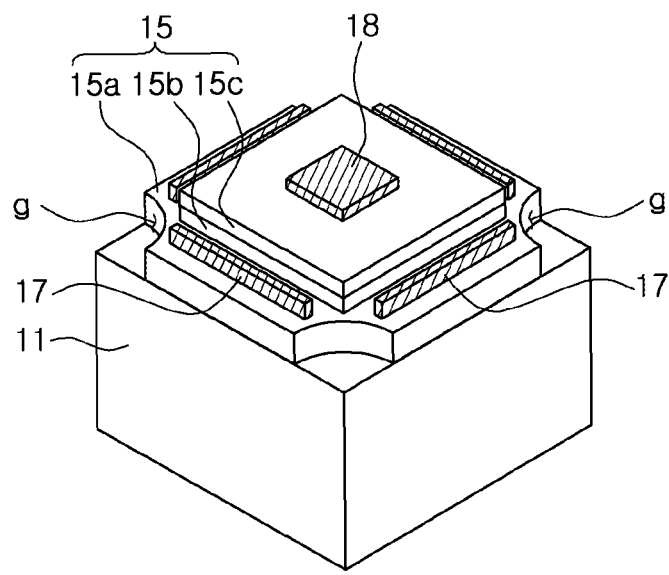
FIG. 3A and FIG. 3B are perspective views of an LED chip and a circuit board employable in a light source module according to some example embodiments of the inventive concepts, respectively.
Figure 3B:
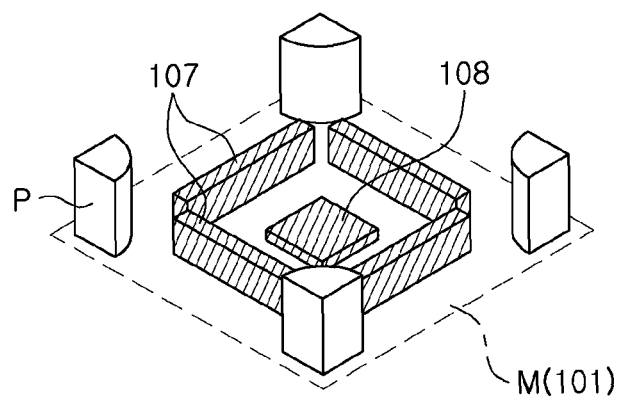

FIG. 3A and FIG. 3B are perspective views of an LED chip and a circuit board employable in a light source module according to some example embodiments of the inventive concepts, respectively.

Referring to FIG. 3A, an LED chip 10 may include a light transmitting substrate 11 and a semiconductor stack 15 on the light transmitting substrate 11. The semiconductor stack 15 may include a first conductive semiconductor layer 15a, an active layer 15b, and a second conductive semiconductor layer 15c. A detailed description of each of the first conductive semiconductor layer 15a, the active layer 15b, and the second conductive semiconductor layer 15c will be understood with reference to the descriptions of FIG. 6 and FIG. 7. The LED chip 10 may include one or more first electrodes 17 and a second electrode 18 on a surface on which a circuit board 101 may be disposed.

Each of the alignment recesses g may extend from a point on an edge of the light transmitting substrate 11 to a point on an edge of the light transmitting substrate 11 adjacent thereto in the semiconductor stack 15. The alignment recesses g may be formed in an isolation process. The isolation process may be defined as selectively removing portions of the semiconductor stack 15 in order for the semiconductor stack 15 to be divided into individual device units at a wafer level. Desired alignment recesses g may be formed by using a mask pattern in which regions of the alignment recesses g may be opened.

The alignment recesses g and alignment components P may be configured to be combined with each other. For example, an alignment recess g and an alignment component P may be configured to complementary couple. The alignment components P may be respectively formed at positions corresponding to those of the alignment recesses g of the LED chip 10 to be disposed. As illustrated in FIG. 3B, the alignment components P may be on four corners of one of the chip mounting regions M at substantially the same intervals as those between the alignment recesses g, respectively.

Contact portions between the alignment components P and the alignment recesses g may have substantially the same shapes as each other (for example, curved surfaces having similar curvatures).

In a process of disposing a given LED chip 10 on a given chip mounting region M, the alignment recesses g of the given LED chip 10 may be coupled to the alignment components P of the given chip mounting region M, and this may allow the given LED chip 10 to be precisely guided to a required position, thereby being disposed on the given chip mounting region M. In such a disposing process, one or more first electrodes 17 and a second electrode 18 of the given LED chip 10 may be accurately disposed on one or more first connection pads 107 and a second connection pad 108 of the given chip mounting region M, respectively. Therefore, a probability of a bad connection caused by misalignment may be reduced and/or prevented in a following bonding process. Some example embodiments may be beneficially applied to micro LED chips which are difficult to accurately align. For example, some example embodiments may be usefully applied to micro LED chips respectively having an area less than or equal to 200 $\mu m^2$.

In some example embodiments, the alignment components P may be exemplified as posts, but may have various shapes. For example, the alignment components P may have a concave structure, and a convex structure corresponding to the concave structure may also be provided as an alignment coupling structure of the LED chip 10.

Figure 4A:
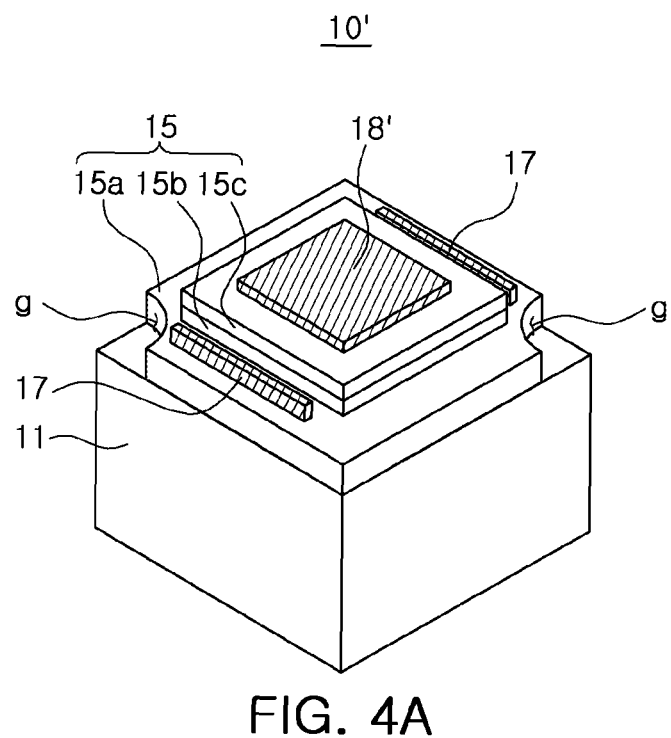
FIG. 4A and FIG. 4B are perspective views of an LED chip and a circuit board employable in a light source module according to some example embodiments of the inventive concepts, respectively.
Figure 4B:
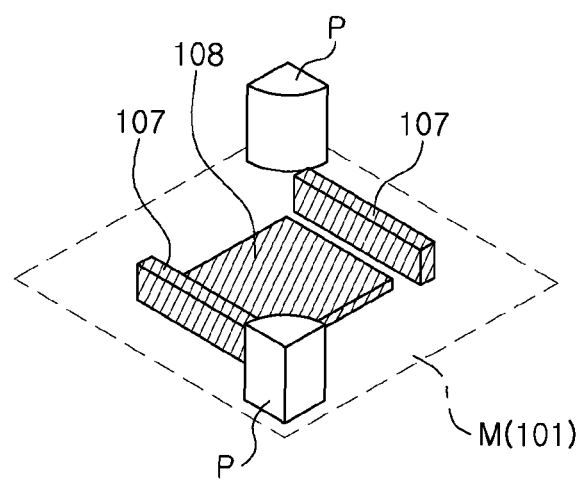

In some example embodiments, the numbers of the alignment components P and the alignment recesses g may be exemplified as four, respectively, but may be employed as one or more if necessary. For example, when a given chip mounting region M includes a single alignment component P and a given LED chip 10 includes a single alignment recess g, the single alignment recess g may be disposed inside of a surface on which the single alignment component P is mounted, other than an edge of the LED chip 10. Examples in which alignment coupling methods different from that of the previous example embodiment are employed are illustrated in FIGS. 4A, 4B and 5. The examples illustrated in FIGS. 4A, 4B and 5 may be understood as examples employable in the light source module 100 illustrated in FIG. 1.

FIG. 4A and FIG. 4B are perspective views of an LED chip and a circuit board employable in a light source module according to some example embodiments of the inventive concepts, respectively.

Referring first to FIG. 4A and FIG. 4B, a chip mounting region M may include two alignment components P disposed thereon in a diagonal direction. An LED chip 10' may include two alignment recesses g formed at positions corresponding to those of the two alignment components P. A second electrode 18' employed in the LED chip 10' may include a magnetic body unlike the previous example embodiment. The magnetic body may include a layer including at least one among Fe, Ni, and Cr. For example, the second electrode 18' may include a Ni layer. The magnetic body may include a magnetized element, including one or more magnets. A magnetic body may be configured to generate a magnetic field.

If and/or when the LED chip 10' is disposed on the chip mounting region M, the second electrode 18' may generate a magnetic field (e.g., "have magnetism") based on the implementation of a magnetization treatment with regard to the second electrode 18', and may be easily attached to a second connection pad 108 of a circuit board 101. In such a process of attaching the second electrode 18' by magnetism, the two alignment components P and the two alignment recesses g may guide the LED chip 10' to be disposed at a more accurate position, resulting in self-alignment of the LED chip 10'.

Therefore, LED chips may be disposed on a circuit board, and may then be moved onto the circuit board with a unit such as a soft roller without a pick and place process of transferring an individual chip by a vacuum chuck, thereby leading to attachment of the LED chips to the circuit board by magnetism. This may allow the LED chips to be aligned at accurate positions, respectively.

In some example embodiments, only the second electrode 18' of the LED chip 10' may include a magnetic body. In some example embodiments, in place of the second electrode 18', the second connection pad 108 of the circuit board 101 may have a magnetic body. In some example embodiments, both the second electrode 18' and the second connection pad 108 may have one or more magnetic bodies, respectively. At least one of first electrodes 17 and first connection pads 107 may also include a magnetic body.

Figure 4C:
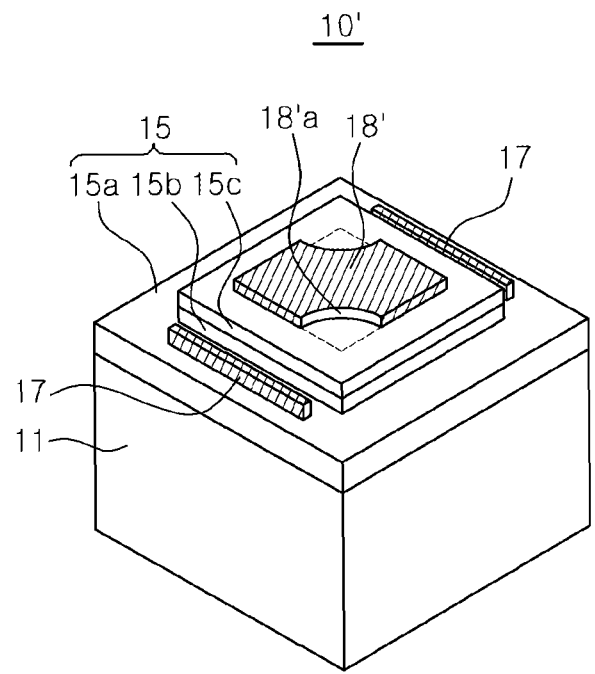
FIG. 4C and FIG. 4D are perspective views of an LED chip and a circuit board employable in a light source module according to some example embodiments of the inventive concepts, respectively.
Figure 4D:
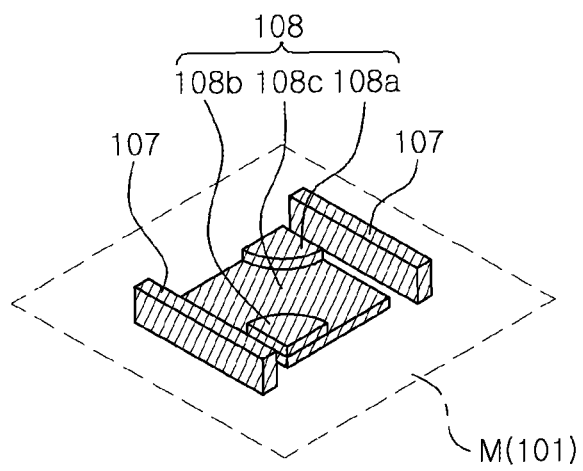

FIG. 4C and FIG. 4D are perspective views of an LED chip and a circuit board employable in a light source module according to some example embodiments of the inventive concepts, respectively.

In the example embodiments illustrated in FIGS. 4C-D, the alignment component P and the alignment recess g are absent as independent elements. As illustrated in FIGS. 4C-D, in some example embodiments, the alignment component P and alignment recess g may be respectively incorporated into separate ones of the second electrode 18' and the second connection pad 108.

Portions of each of the second electrode 18' of the LED chip 10' and the second connection pad 108 of the chip mounting region M may have substantially the same shapes as each other (for example, curved surfaces having similar curvatures), such that the portions of the second electrode 18' and the second connection pad 108 may couple together in a complementary fit. As shown in FIGS. 4C-D, for example, portions of each of the second electrode 18' of the LED chip 10' and the second connection pad 108 of the chip mounting region M may be shaped to fit together (e.g., "combine with each other") in a complementary coupling ("complementary fit") of the second electrode 18' and second connection pad 108. Coupling the second electrode 18' and the second connection pad 108 in a complementary fit may be referred to as coupling the second electrode 18' and the second connection pad 108 to form a complementary fit of the second electrode 18' and the second connection pad 108.

If and/or when the second electrode 18' and the second connection pad 108 are coupled together to form a complementary fit of the second electrode 18' and the second connection pad 108, at least a portion of both the second electrode 18' and the second connection pad 108 may be co-planar and sidewalls of similarly shaped portions of the second electrode 18' and second connection pad 108 may be in flush contact with each other.

As shown in FIGS. 4C-D, the second connection pad 108 includes two separate protruding portions 108a and 108b and a base portion 108c, and the second electrode 18' is shaped such that sidewalls 18'a of the second electrode 18' are in flush or substantially flush contact with similarly-shaped sidewalls 108aa of the connection protruding portions 108a and 108b if and/or when the second electrode 18' is coupled with, and at least partially co-planar with the second connection pad 108, such that a complementary fit of the second electrode 18' and the second connection pad 108 is formed.

As shown in FIGS. 4C-D, the second electrode 18' has two concave shaped portions and the protruding portions 108a and 108b of the second connection pad 108 have convex shapes that are complementary (e.g., similarly shaped) to the concave shaped portions of the second electrode 18'. The convex and concave shapes of the second connection pad 108 and the second electrode 18', respectively, may have a substantially similar curvature. In some example embodiments, one or more portions of the second electrode 18' may have a convex shape and one or more portions of the second connection pad 108 may have a complementary concave shape. In some example embodiments, the second electrode 18' may include a convex shaped portion and a concave shaped portion, and the second connection pad 108 may include a concave shaped portion that is complementary to the convex shaped portion of the second electrode 18' and a convex shaped portion that is complementary to the concave shaped portion of the second electrode 18'.

In some example embodiments, the base portion 108c may be absent, and the second connection pad 108 may include separate pads 108a and 108b. The separate pads 108a and 108b may be coupled together via one or more electrical links (not shown in FIGS. 4C-D), including one or more instances of wiring, a wiring layer, an electrically conductive layer, some combination thereof, or the like.

As shown, the second electrode 18' is configured to be in a particular orientation, relative to the chip mounting region M, if the second electrode 18' is coupled to the second connection pad 108 to form a complementary fit of the second electrode 18' and the second connection pad 108, based on the complementary shapes of one or more portions of the second electrode 18' and the second connection pad 108, respectively. Therefore, the LED chip 10' may be aligned in a particular orientation, relative to the chip mounting region M, when the second electrode 18' is coupled to the second connection pad 108 to form the complementary fit. As a result, the LED chip 10' may be aligned with the chip mounting region M if and/or when the second electrode 18' is coupled with the second connection pad 108.

Use of the second electrode 18' and second connection pad 108 illustrated in FIGS. 4C-D, according to some example embodiments, may allow for a precise alignment of the LED chip 10', and may enable a probability of a bad connection between the LED chip 10' and the chip mounting region M to be reduced and/or prevented.

An example in which magnetic properties required for alignment of an LED chip are provided to an electrode and a connection pad is illustrated, but is not limited thereto. The LED chip may be accurately aligned by adding magnetic bodies to regions of the LED chip and a circuit board, respectively. As a typical example, as illustrated in FIG. 5A and FIG. 5B, a method of giving magnetic properties to an alignment component and an alignment recess, respectively, may be used.

Figure 5A:
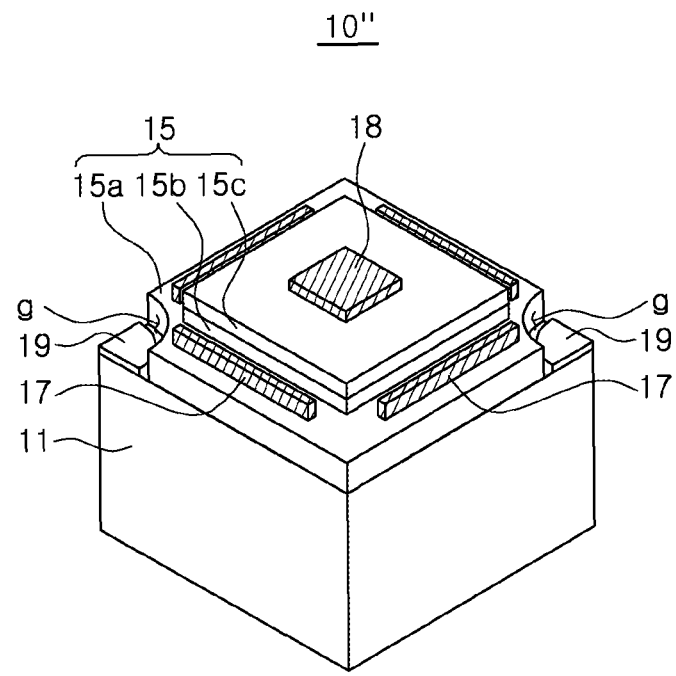
FIG. 5A and FIG. 5B are perspective views of an LED chip and a circuit board employable in a light source module according to some example embodiments of the inventive concepts, respectively.
Figure 5B:
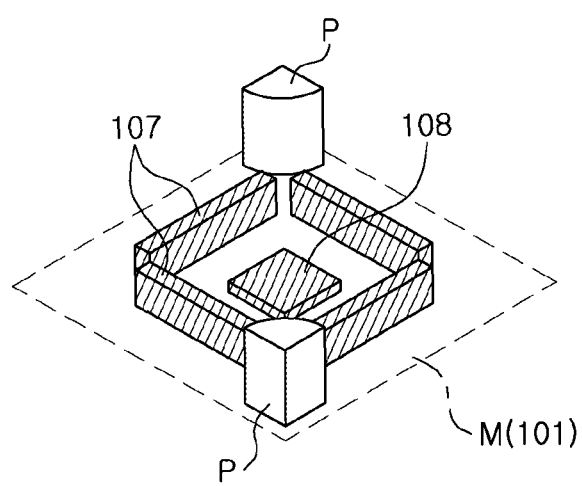

FIG. 5A and FIG. 5B are perspective views of an LED chip and a circuit board employable in a light source module according to some example embodiments of the inventive concepts, respectively.

Referring to FIG. 5A, a chip mounting region M may have two alignment components P disposed thereon in a diagonal direction. An LED chip 10" may include two alignment recesses g formed at positions corresponding to those of the two alignment components P, and may have alignment pads 19 respectively disposed on exposed portions of the two alignment recesses g. Unlike the previous example embodiment, a magnetic body may be included in at least one of the alignment pads 19 and the two alignment components P.

When the LED chip 10" is disposed on the chip mounting region M, a magnetic force resulting from a magnetic field generated by the alignment pads 19 may allow the two alignment components P to be easily guided to the two alignment recesses g, respectively, while the two alignment components P may be attached to the alignment pads 19, respectively.

In addition to the LED chips exemplified in the previous example embodiments, various structures of LED chips may be employed.

Figure 6:
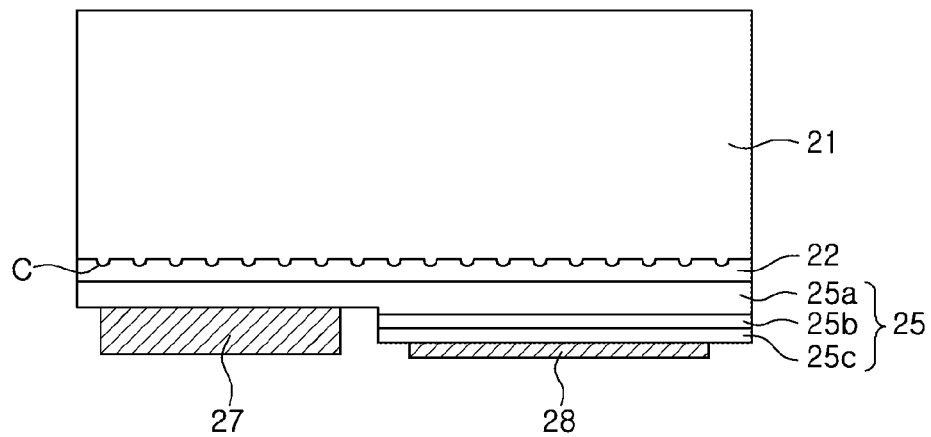
FIG. 6 and FIG. 7 are cross-sectional views of various structures of LED chips employable according to some example embodiments of the inventive concepts, respectively.
Figure 7:
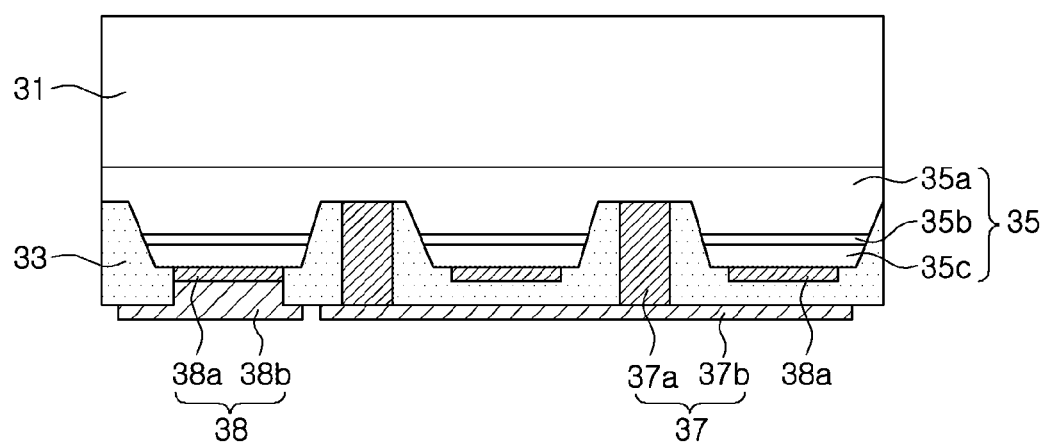

FIG. 6 and FIG. 7 are cross-sectional views of various structures of LED chips employable according to some example embodiments of the inventive concepts, respectively.

An LED chip 20 illustrated in FIG. 6 may include a light transmitting substrate 21 and a semiconductor stack 25 on the light transmitting substrate 21.

The light transmitting substrate 21 may be an insulating substrate, including sapphire. The light transmitting substrate 21 is, however, not limited thereto, and may be a conductive substrate or a semiconductor substrate which may secure light transmitting properties, other than the insulating substrate. An uneven pattern (C) may be formed on an upper surface of the light transmitting substrate 21. The uneven pattern (C) may increase light extraction efficiency, and may improve quality of a single crystal being grown.

The semiconductor stack 25 may include a first conductive semiconductor layer 25a, an active layer 25b, and a second conductive semiconductor layer 25c. A buffer layer 22 may be disposed between the light transmitting substrate 21 and the first conductive semiconductor layer 25a.

The buffer layer 22 may have a composition of $In_xAl_yGa_{1-x-y}N$ ($0 \leq x \leq 1$, $0 \leq y \leq 1$). For example, the buffer layer 22 may include GaN, AlN, AlGaN, or InGaN. If necessary, the buffer layer 22 may also be formed by combining a plurality of layers or gradually changing compositions thereof.

The first conductive semiconductor layer 25a may be a nitride semiconductor layer satisfying a composition of n-type $In_xAl_yGa_{1-x-y}N$ ($0 \leq x \leq 1$, $0 \leq y < 1$, $0 \leq x+y < 1$), and an n-type impurity may be Si. For example, the first conductive semiconductor layer 25a may contain n-type GaN. The second conductive semiconductor layer 25c may be a nitride semiconductor layer satisfying a composition of p-type $In_xAl_yGa_{1-x-y}N$ ($0 \leq x < 1$, $0 \leq y < 1$, $0 \leq x+y < 1$), and a p-type impurity may be Mg. For example, the second conductive semiconductor layer 25c may be implemented as a single layer structure, but as in some example embodiments, may have a multilayer structure having different compositions. The active layer 25b may have a multiple quantum well (MQW) structure in which quantum well layers and quantum barrier layers are alternately stacked with each other. For example, the quantum well layers and the quantum barrier layers may include different compositions of $In_xAl_yGa_{1-x-y}N$ ($0 \leq x \leq 1$, $0 \leq y \leq 1$, $0 \leq x+y \leq 1$), respectively. In a certain example, the quantum well layers may include a composition of $In_xGa_{1-x}N$ ($0 < x \leq 1$), and the quantum barrier layers may include GaN or AlGaN. The active layer 25b is not limited to the MQW structure, and may have a single quantum well (SQW) structure.

A first electrode 27 and a second electrode 28 may be disposed on a mesa-etched region of the first conductive semiconductor layer 25a, and the second conductive semiconductor layer 25c, respectively, so that the first electrode 27 and the second electrode 28 may be positioned on the same side of the LED chip 30 (a first surface of the LED chip 30). For example, the first electrode 27 may contain at least one of Al, Au, Cr, Ni, Ti, and Sn. The second electrode 28 may include a reflective metal. For example, the second electrode 28 may contain a material such as Ag, Ni, Al, Cr, Rh, Pd, Ir, Ru, Mg, Zn, Pt, or Au, and may be employed as a structure having a single layer or two or more layers.

An LED chip 30 illustrated in FIG. 7 may include a semiconductor stack 35 disposed on a surface of a light transmitting substrate 31. The semiconductor stack 35 may include a first conductive semiconductor layer 35a, an active layer 35b, and a second conductive semiconductor layer 35c.

The LED chip 30 may include a first electrode 37 and a second electrode 38 respectively connected to the first conductive semiconductor layer 35a and the second conductive semiconductor layer 35c. The first electrode 37 may include connecting electrode portions 37a, such as conductive vias, passing through the second conductive semiconductor layer 35c and the active layer 35b to be connected to the first conductive semiconductor layer 35a, and a first electrode pad 37b connected to the connecting electrode portions 37a.

The connecting electrode portions 37a may be surrounded by insulating portions 33 to be electrically separated from the active layer 35b and the second conductive semiconductor layer 35c. The connecting electrode portions 37a may be disposed on an area from which the semiconductor stack 35 is etched. The connecting electrode portions 37a may be properly designed in terms of number, shape, pitch, or contact area with the first conductive semiconductor layer 35a so that contact resistance may be reduced. The connecting electrode portions 37a may also be arranged to form rows and columns on the semiconductor stack 35 to improve a current flow. The second electrode 38 may include an ohmic contact layer 38a disposed on the second conductive semiconductor layer 35c and a second electrode pad 38b disposed below the second conductive semiconductor layer 35c.

The connecting electrode portions 37a and the ohmic contact layer 38a may include a single layer or a multilayer structure formed of the first and second conductive semiconductor layers 35a and 35b and a conductive material having ohmic characteristics. For example, the connecting electrode portions 37a and the ohmic contact layer 38a may be formed using a process of depositing or sputtering at least one of materials such as Ag, Al, Ni, Cr, or a transparent conductive oxide (TCO). The first and second electrode pads 37b and 38b may be connected to the connecting electrode portions 37a and the ohmic contact layer 38a, respectively, to function as an external terminal of the LED chip 30. For example, the first and second electrode pads 37b and 38b may contain Au, Ag, Al, Ti, W, Cu, Sn, Ni, Pt, Cr, NiSn, TiW, AuSn, or eutectic metals thereof. For example, the insulating portions 33 may include a silicon oxide and a silicon nitride such as $SiO_2$, $SiO_xN_y$, and $Si_xN_y$. The insulating portions 33 may be formed by dispersing a light-reflective filler in a light transmitting material, or introducing a DBR structure in order to secure higher reflectivity.

An LED chip or a light source module according to some example embodiments may be usefully applied to a display panel.

Figure 8:
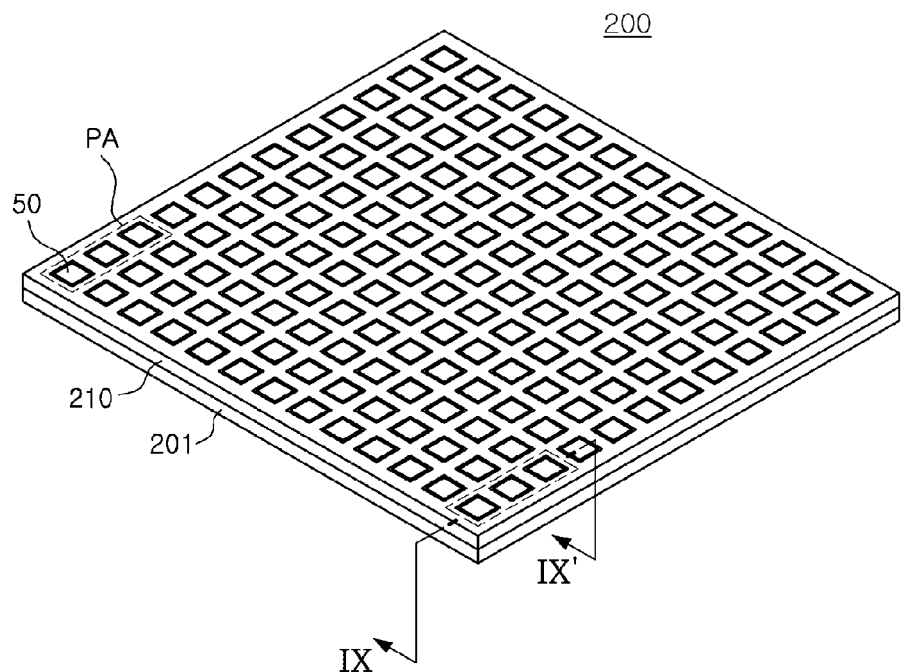
FIG. 8 is a schematic perspective view of a display panel according to some example embodiments of the inventive concepts.

FIG. 8 is a schematic perspective view of a display panel according to some example embodiments of the inventive concepts.

A display panel 200 illustrated in FIG. 8 may include a circuit board 201 and a plurality of LED chips 50 disposed on the circuit board 201. The display panel 200 may be disposed on the circuit board 201, and may further include a black matrix 210 surrounding the plurality of LED chips 50. The black matrix 210 is not limited to black. A white matrix or a green matrix may be used as the black matrix 210 depending on purposes or uses of products, and a matrix formed of a transparent material may be used in place of the black matrix 210 if necessary. The white matrix may further contain a reflective material or a light scattering material.

The black matrix 210 or a guide layer containing a material similar to that of the black matrix 210 may be applied to the light source module 100 illustrated in FIG. 1. The black matrix 210 may include at least one among materials such as a polymer containing a resin, a ceramic, a semiconductor, and a metal.

The plurality of LED chips 50 may form a plurality of RGB (red, green, and blue) sub-pixels, respectively. Three RGB sub-pixels may form a single pixel PA, and such a single pixel PA may be consecutively arranged.

The LED chips 50 may be combined with a wavelength conversion material such as a phosphor to emit blue, green, or red light, and also to emit white light or ultraviolet light. The phosphor may be stacked or coated on at least one surface of a light transmitting substrate 51 or each of the LED chips 50.

The phosphor may contain at least one type of wavelength conversion material that may be excited by light emitted by a semiconductor stack 55 of each of the LED chips 50 to emit light having a wavelength different from that of the light emitted by the semiconductor stack 55. This may allow a wavelength of light to be controlled so that various colors of light may be emitted.

For example, when the semiconductor stack 55 emits blue light, white light may be emitted by combinations of yellow, green, red and/or orange phosphors. In addition, each of the LED chips 50 may further include a semiconductor stack 55 that may emit violet, blue, green, red, or infrared light. In this case, the LED chips 50 may control a color rendering index (CRI) of light to be from 40 to 100, and a color temperature of light to be from about 2,000K to about 20,000K, thereby emitting white light having various CRIs and color temperatures. If necessary, the LED chips 50 may also emit violet, blue, green, red, and orange visible light or infrared light to control color of light according to the display panel 200's surroundings or mood. The LED chips 50 may also emit light having a certain wavelength that is able to promote plant growth.

White light generated by combining yellow, green, and red phosphors with a blue LED chip, and/or a green LED chip and a red LED chip with the blue LED chip, may have two or more peak wavelengths.

The phosphor may have the following formulae and colors: Oxide-based phosphor: yellow and green $Y_3Al_5O_{12}$:Ce, yellow and green $Tb_3Al_5O_{12}$:Ce, and yellow and green $Lu_3Al_5O_{12}$:Ce; Silicate-based phosphor: yellow and green $(Ba,Sr)_2SiO_4$:Eu and yellow and orange $(Ba,Sr)_3SiO_5$:Ce; Nitride-based phosphor: green β-SiAlON:Eu, yellow $La_3Si_6N_{11}$:Ce, orange α-SiAlON:Eu, red $CaAlSiN_3$:Eu, red $Sr_2Si_5N_8$:Eu, red $SrSiAl_4N_7$:Eu, red $SrLiAl_3N_4$:Eu, and red $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), in which Ln may be at least one type of element selected from the group consisting of group IIIa elements and rare earth elements, and M may be at least one type of element selected from the group consisting of Ca, Ba, Sr and Mg; and Fluoride-based phosphor: KSF-based red phosphor, such as $K_2SiF_6$:$Mn^{4+}$, $K_2TiF_6$:$Mn^{4+}$, $NaYF_4$:$Mn^{4+}$, red $NaGdF_4$:$Mn^{4+}$, and $K_3SiF_7$:$Mn^{4+}$.

In some example embodiments, the three RGB sub-pixels may be arranged in the single pixel PA in parallel with each other in a single direction, but may have various arrangements if necessary. For example, the three RGB sub-pixels may have a triangular arrangement. RGB sub-pixels may be exemplified as being arranged in a 12×12 matrix (4 pixel groups each including three RGB sub-pixels) in perpendicular and horizontal directions, respectively, but this is for ease of description. Actually, the RGB sub-pixels may be arranged by pixel number depending on a required resolution (for example, 1,024×768).

The circuit board 201 may include a circuit configured to independently operate RGB sub-pixels of each pixel PA. For example, the circuit board 201 may include a thin film transistor (TFT).

Figure 9:
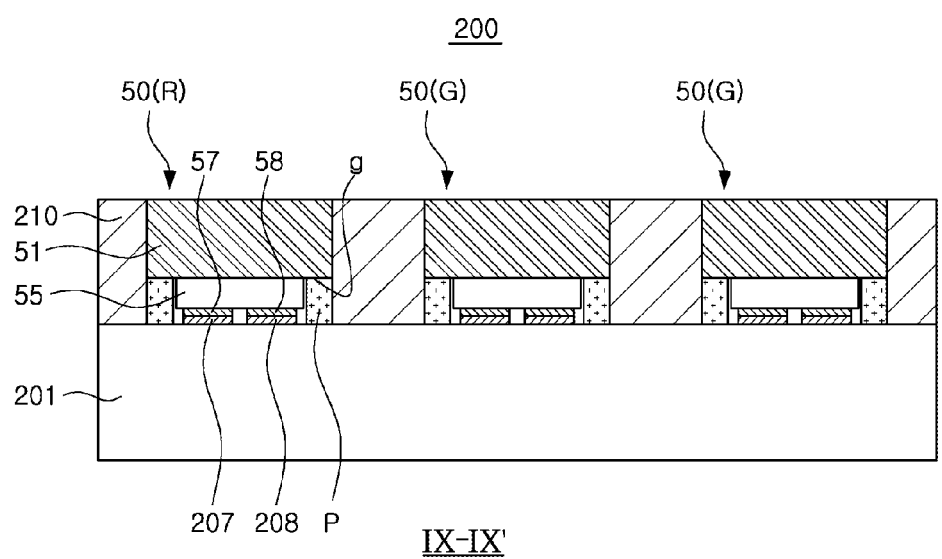
FIG. 9 is aside section view taken along line IX-IX' (a pixel region) of the display panel illustrated in FIG. 8.

FIG. 9 is a side section view taken along line IX-IX' (a pixel region) of the display panel 200 illustrated in FIG. 8.

Referring to FIG. 9, a plurality of LED chips 50 may be disposed on the circuit board 201 in such a manner that a first electrode 57 and a second electrode 58 may be respectively connected to a first connection pad 207 and a second connection pad 208.

Each of the LED chips 50 disposed on the circuit board 201 may include the light transmitting substrate 51, and a semiconductor stack 55 disposed on the light transmitting substrate 51. The LED chips 50 may be understood as having a structure similar to that of the LED chips 20 and 30 respectively illustrated in FIG. 6 and FIG. 7. Each of the LED chips 50 employed in some example embodiments may include alignment recesses g which may each extend from a point on an edge of the light transmitting substrate 51 to a point on an edge of the light transmitting substrate 51 in the semiconductor stack 55.

A plurality of alignment components P may be disposed on a region on which each of the LED chips 50 is disposed, and the alignment recesses g of each of the LED chips 50 may be coupled to the alignment components P, respectively.

The alignment components P may be respectively disposed at positions corresponding to those of the alignment recesses g of each of the LED chips 50. In the process of disposing the LED chips 50, the alignment recesses g may be coupled to the alignment components P, respectively, and this may allow the LED chips 50 to be precisely guided to required positions, respectively, thereby being disposed on the regions. In some example embodiments, a magnetic layer such as a Ni layer may be introduced to at least one of the first and second electrodes 57 and 58 and the first and second connection pads 207 and 208. For example, when the first and second electrodes 57 and 58 of each of the LED chips 50 form a multilayer structure, one layer of the multilayer structure may include the magnetic layer such as the Ni layer.

The black matrix 210 may be disposed on the circuit board 201 to surround the plurality of LED chips 50. The black matrix 210 may serve to reduce and/or prevent light leakage from the LED chips 50 that may form the RGB sub-pixels. The black matrix 210 may contain a metallic compound such as CrO or a metal such as Cr.

Figure 10:
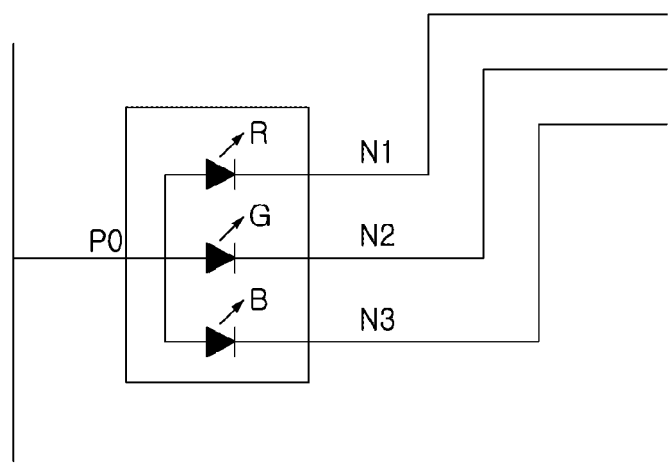
FIG. 10 is an example of a circuit configuration included in the pixel region of the display panel illustrated in FIG. 8.

FIG. 10 is an example of a circuit configuration included in the single pixel PA of the display panel 200 illustrated in FIG. 8. An LED indicated as R, G, and B may be understood as the LED chips 50 that may be arranged in the display panel 200 illustrated in FIG. 8 to form the RGB sub-pixels.

The LED R, G, and B forming the RGB sub-pixels may have various types of circuit configurations to be individually driven. For example, as illustrated in FIG. 10, an anode P0 of the LED R, G, and B may be connected to a drain of a P-MOS along with an anode of another LED R, G, and B positioned in the same row and included in another cell. Cathodes N1, N2, and N3 of the LED R, G, and B may be connected to constant current input terminals of an LED driver circuit by colors in the same column, respectively. A source of the P-MOS may be connected to a power supply terminal, and a gate thereof may be connected to a row power supply control port. A control unit may allow a drain of a single P-MOS to be turned on to supply power to an anode of an LED in a row thereof, and a constant current control signal output port may enable the LED driver circuit to be controlled, thereby turning on the LED to which the power is supplied.

Figure 11:
FIG. 11 is a block diagram illustrating a configuration of a display device according to some example embodiments of the inventive concepts.

FIG. 11 is a block diagram illustrating a configuration of a display device according to some example embodiments of the inventive concepts.

Referring to FIG. 11, the display panel 200 illustrated in FIG. 8 may form a display device along with a panel driving unit 220 and a control unit 250. Here, the display device may be implemented as displays of various electronic devices such as a TV, an electronic blackboard, an electronic table, a large format display (LFD), a smartphone, a tablet PC, a desktop PC, and a laptop PC.

The panel driving unit 220 may drive the display panel 200, and the control unit 250 may control the panel driving unit 220. The panel driving unit 220 controlled by the control unit 250 may be configured so that each of the plurality of RGB sub-pixels may be independently turned on/off.

For example, the panel driving unit 220 may transmit a clock signal having a certain driving frequency to each of the plurality of RGB sub-pixels so that each of the plurality of RGB sub-pixels may be turned on/off. The control unit 250 may control the panel driving unit 220 so that the plurality of RGB sub-pixels may be turned on in group units as which the RGB sub-pixels are set in response to an input image signal, thereby displaying a required image on the display panel 200.

One or more of the panel driving unit 220 and the control unit 250 may include a memory and a processor. The memory may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM). The processor may be, a central processing unit (CPU), a controller, or an application-specific integrated circuit (ASIC), that when, executing instructions stored in the memory, configures the processor as a special purpose computer to perform the operations of one or more of the panel driving unit 220 and the control unit 250.

Figure 12A:
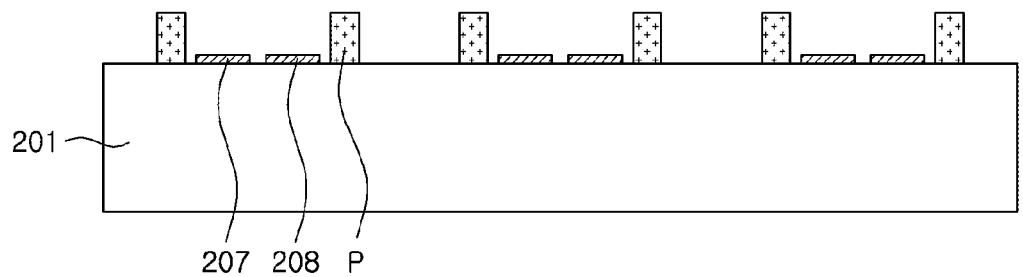
FIG. 12A, FIG. 12B, and FIG. 12C are cross-sectional views of a process of manufacturing the display panel illustrated in FIG. 8, respectively.
Figure 12B:
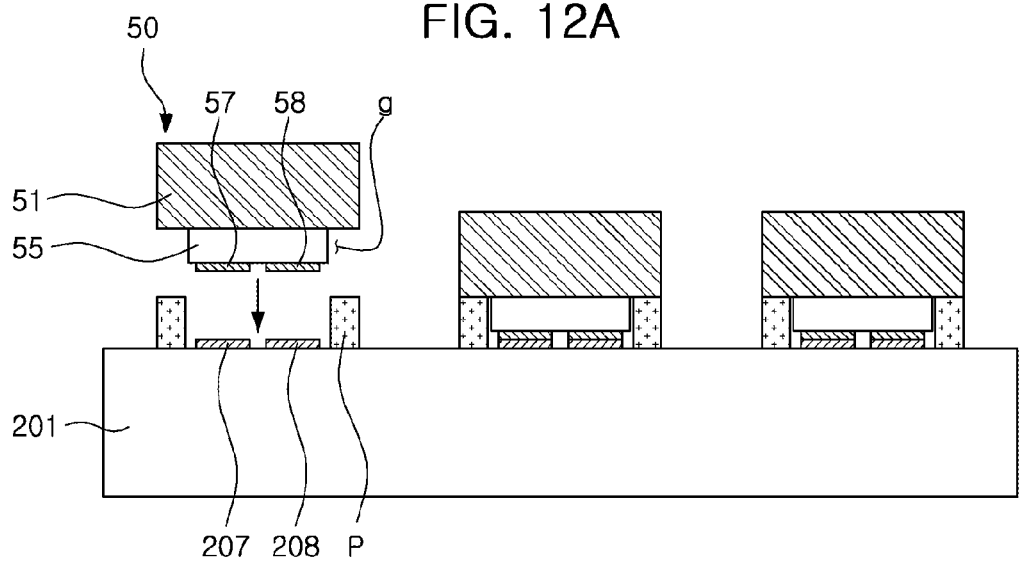
Figure 12C:
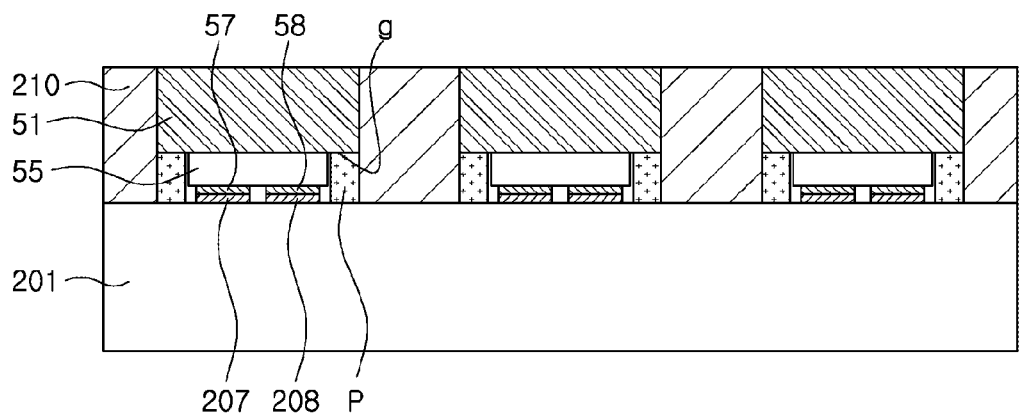

FIG. 12A, FIG. 12B, and FIG. 12C are cross-sectional views of a process of manufacturing the display panel 200 illustrated in FIG. 8, respectively.

As illustrated in FIG. 12A, first and second connection pads 207 and 208 may be formed on each of chip mounting regions of a circuit board 201, sub-pixel regions. In addition, alignment components P may be formed on edges of each of the sub-pixel regions, respectively. The alignment components P may be structures having a micro size, and may be formed of a material that may be deposited using a semiconductor process. The alignment components P may be formed of a magnetic body that may be magnetized, if necessary.

As illustrated in FIG. 12B, LED chips 50 may be aligned on the chip mounting regions, respectively. By coupling alignment recesses g of each of the LED chips 50 to the alignment components P, first and second electrodes 57 and 58 may be precisely aligned on the first and second connection pads 207 and 208, respectively. In particular, when each of the LED chips 50 is a micro LED chip having an area less than or equal to 200 µm², and further having an area less than or equal to 150 µm², a size of each of the first and second connection pads 207 and 208 may be less than or equal to 50 µm, and a bad connection may thus be more likely to occur in a process of aligning and bonding the LED chips 50. Use of the alignment components P and the alignment recesses g according to some example embodiments may allow for a precise alignment of the micro LED chip 50, and may enable the above-mentioned bad connection to be reduced and/or prevented.

As illustrated in FIG. 12C, a black matrix 210 may be formed on the circuit board 201 to surround the plurality of LED chips 50. For example, a metallic compound such as CrO, or a metal such as Cr may be deposited on the circuit board 201, and portions of the LED chips 50 may be exposed using a grinding process or the like, thereby forming a black matrix 210. If necessary, a process of forming a black matrix may be performed before alignment of LED chips (refer to FIG. 16).

Figure 13:
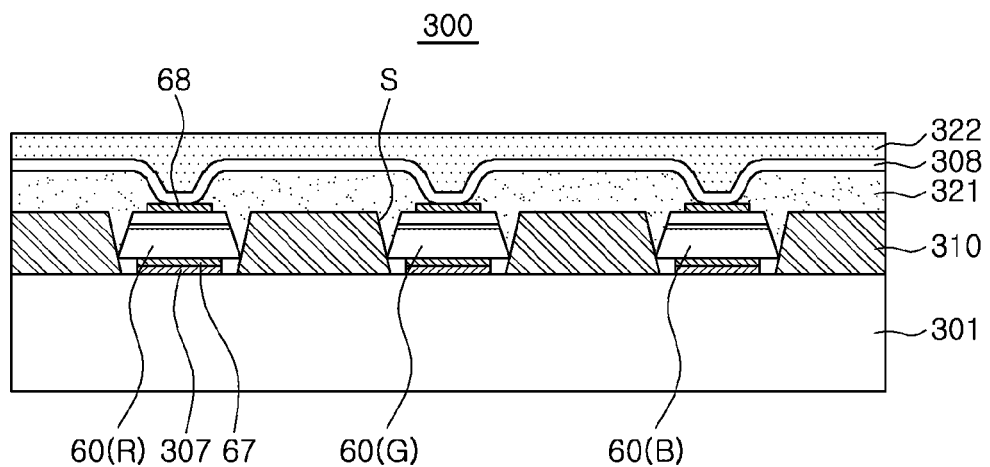
FIG. 13 is a side section view of a pixel region of a display panel according to some example embodiments of the inventive concepts.

FIG. 13 is a side section view of a pixel region of a display panel according to some example embodiments of the inventive concepts.

Referring to FIG. 13, a display panel 300 may include a circuit board 301, and a plurality of LED chips 60 disposed on the circuit board 301.

The plurality of LED chips 60 may be understood as being arranged similarly to FIG. 8. The respective LED chips 60 may form a plurality of RGB sub-pixels. Three RGB sub-pixels may form a single pixel, and such a single pixel may be consecutively arranged.

Figure 14:
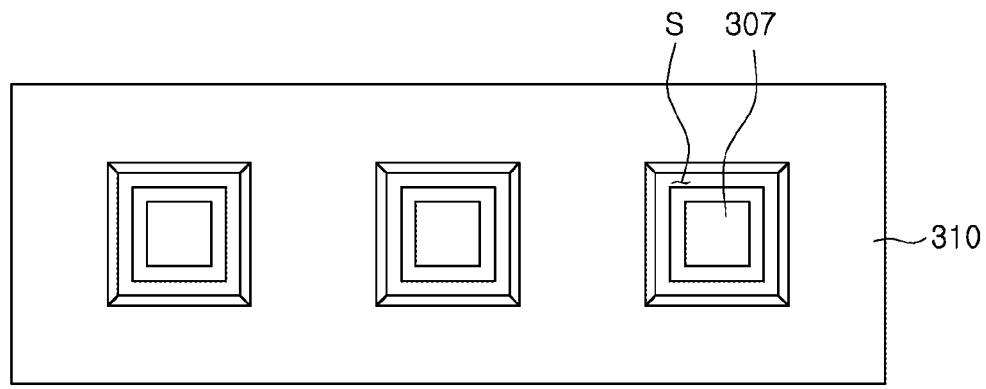
FIG. 14 is a plan view of the pixel region of the display panel illustrated in FIG. 13.
Figure 15:
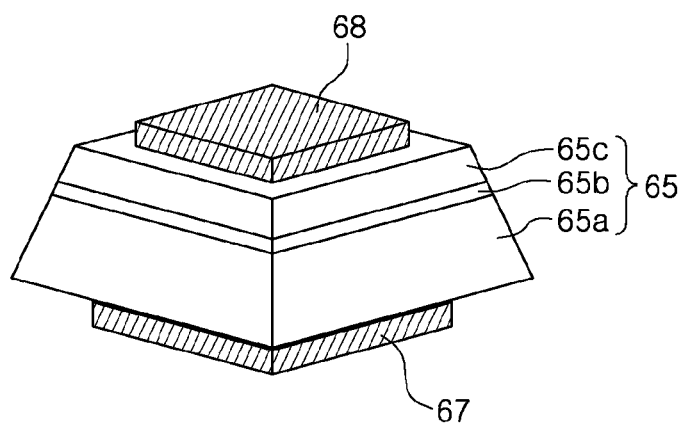
FIG. 15 is a view of a structure of an LED chip employed in the display panel illustrated in FIG. 14.

FIG. 14 is a plan view of the pixel region of the display panel illustrated in FIG. 13. FIG. 15 is a view of a structure of an LED chip employed in the display panel illustrated in FIG. 14.

The display panel 300 may be disposed on the circuit board 301, and may further include a black matrix 310 surrounding the plurality of LED chips 60. As illustrated in FIG. 14, the black matrix 310 may be formed on the circuit board 301 prior to the disposing of the LED chips 60, and chip mounting spaces S may be opened. The chip mounting spaces S may be used as spaces for aligning the LED chips 60. This will be described in more detail in FIG. 16C.

Each of the LED chips 60 employed in some example embodiments may have a vertical structure as illustrated in FIG. 15. Each of the LED chips 60 may include a semiconductor stack 65, which includes a first conductive semiconductor layer 65a, a second conductive semiconductor layer 65c, and an active layer 65b disposed therebetween. A first electrode 67 and a second electrode 68 of each of the LED chips 60 may be disposed on an opposite side of the semiconductor stack 65 to be connected to the first conductive semiconductor layer 65a and the second conductive semiconductor layer 65c, respectively. The first electrode 67 may be connected to a connection pad 307 positioned on the circuit board 301 when the LED chips 60 are disposed in the chip mounting spaces S, respectively. The second electrodes 68 of the LED chips 60 may be connected to an electrode wiring layer 308. The electrode wiring layer 308 may be formed on a first insulating layer 321. For example, the electrode wiring layer 308 may include a transparent electrode such as ITO. The electrode wiring layer 308 may be covered by a second insulating layer 322, and an upper surface of the second insulating layer 322 may be flattened.

FIG. 16A, FIG. 16B, FIG. 16C, FIG. 16D, and FIG. 16E are cross-sectional views of a process of manufacturing the display panel 300 illustrated in FIG. 13, respectively.

Figure 16A:
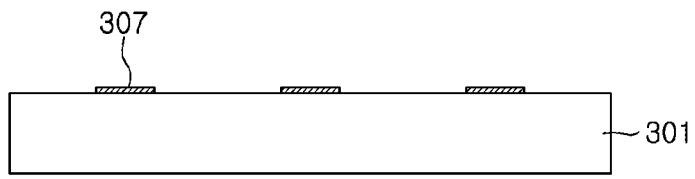
FIG. 16A, FIG. 16B, FIG. 16C, FIG. 16D, and FIG. 16E are cross-sectional views of a process of manufacturing the display panel illustrated in FIG. 13, respectively.

As illustrated in FIG. 16A, connection pads 307 may be formed on a circuit board 301. The circuit board 301 may include a circuit wiring connecting LED chips to be disposed in chip mounting spaces S, respectively. For example, the circuit board 301 may include a TFT.

Figure 16B:
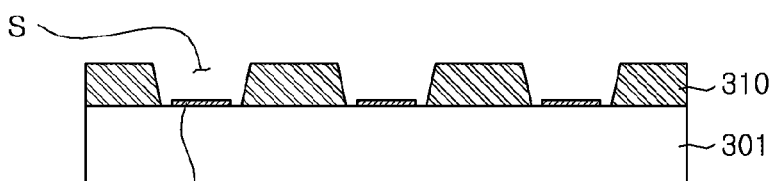

As illustrated in FIG. 16B, a black matrix 310 may be formed to have chip mounting spaces S. The chip mounting spaces S may define sub-pixel regions, respectively, and may allow the connection pads 307 to be exposed therethrough.

Figure 16C:
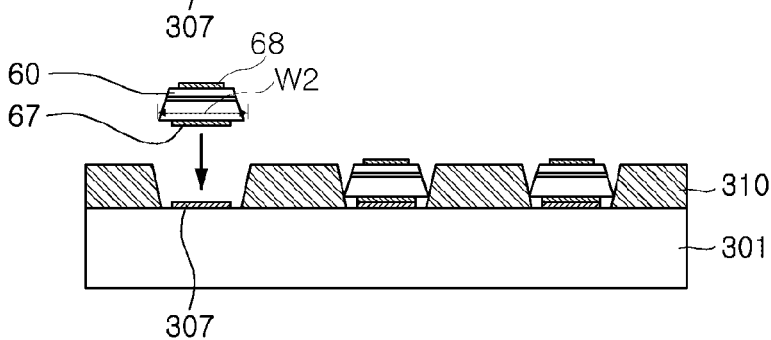

As illustrated in FIG. 16C, each of the chip mounting spaces S on the circuit board 301 may have a bottom width w1 corresponding to a width w2 of each of the LED chips 60. In this case, the LED chips 60 may be precisely aligned on required regions, respectively, while disposed thereon. Such an alignment process may allow the first electrode 67 of each of the LED chips 60 and the connection pad 307 to be accurately connected to each other. As such, in some example embodiments, the chip mounting spaces S (recessed spaces) provided by the black matrix 310 may act as elements similar to alignment components.

Figure 16D:
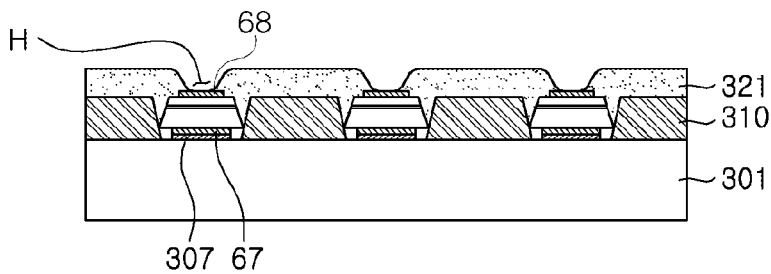
Figure 16E:
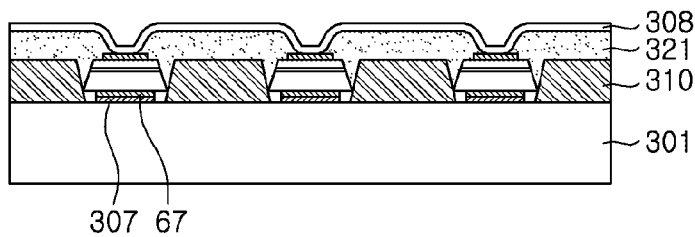

As illustrated in FIG. 16D, a first insulating layer 321 may be formed to have openings H respectively exposing second electrodes 68 of the disposed LED chips 60. As subsequently illustrated in FIG. 16E, an electrode wiring layer 308 may be formed to be connected to the second electrodes 68 exposed through the openings H of the first insulating layer 321, thereby enabling a connection between the electrode wiring layer 308 and a LED chip 60.

Figure 17:
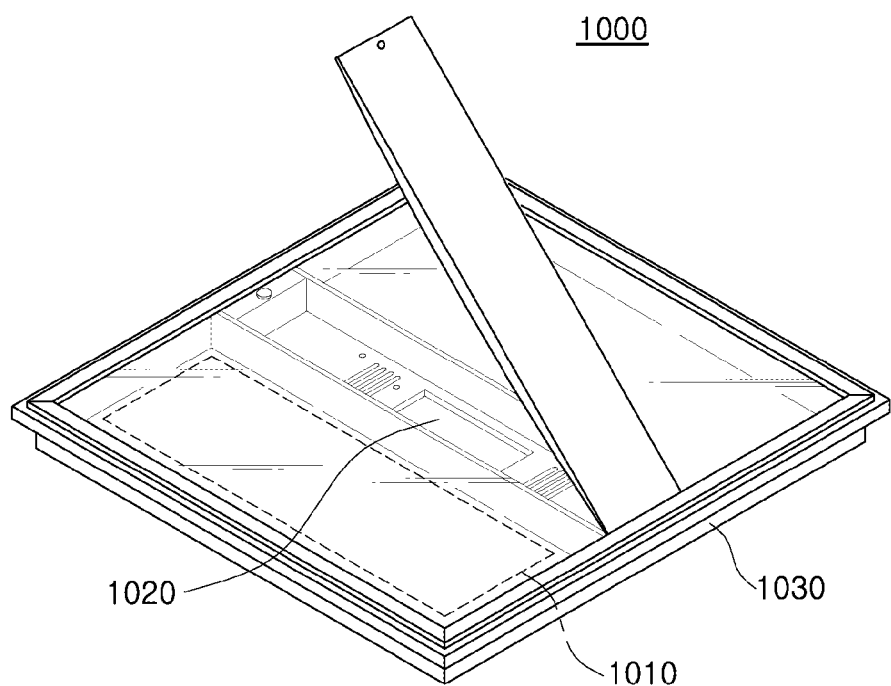
FIG. 17 is a perspective view of a flat lighting device in which a light source module according to some example embodiments of the inventive concepts may be employed.

FIG. 17 is a perspective view of a flat lighting device in which a light source module according to some example embodiments of the inventive concepts may be employed.

Referring to FIG. 17, a flat lighting device 1000 may include a light source module 1010, a power supply 1020, and a case 1130. According to some example embodiments, the light source module 1010 may include the light source module 100 illustrated in FIG. 1. The power supply 1020 may include a light source module driver.

The light source module 1010 may have an overall flat shape. According to some example embodiments, the light source module 1010 may include a plurality of semiconductor light emitting devices and a controller storing driving information of the semiconductor light emitting devices.

The power supply 1020 may be configured to supply power to the light source module 1010. The case 1030 may have a space so that the light source module 1010 and the power supply 1020 may be accommodated therein, and may have a hexahedral shape with an open side surface thereof, but is not limited thereto. The light source module 1010 may be disposed to emit light to the open side surface of the case 1030.

Figure 18:
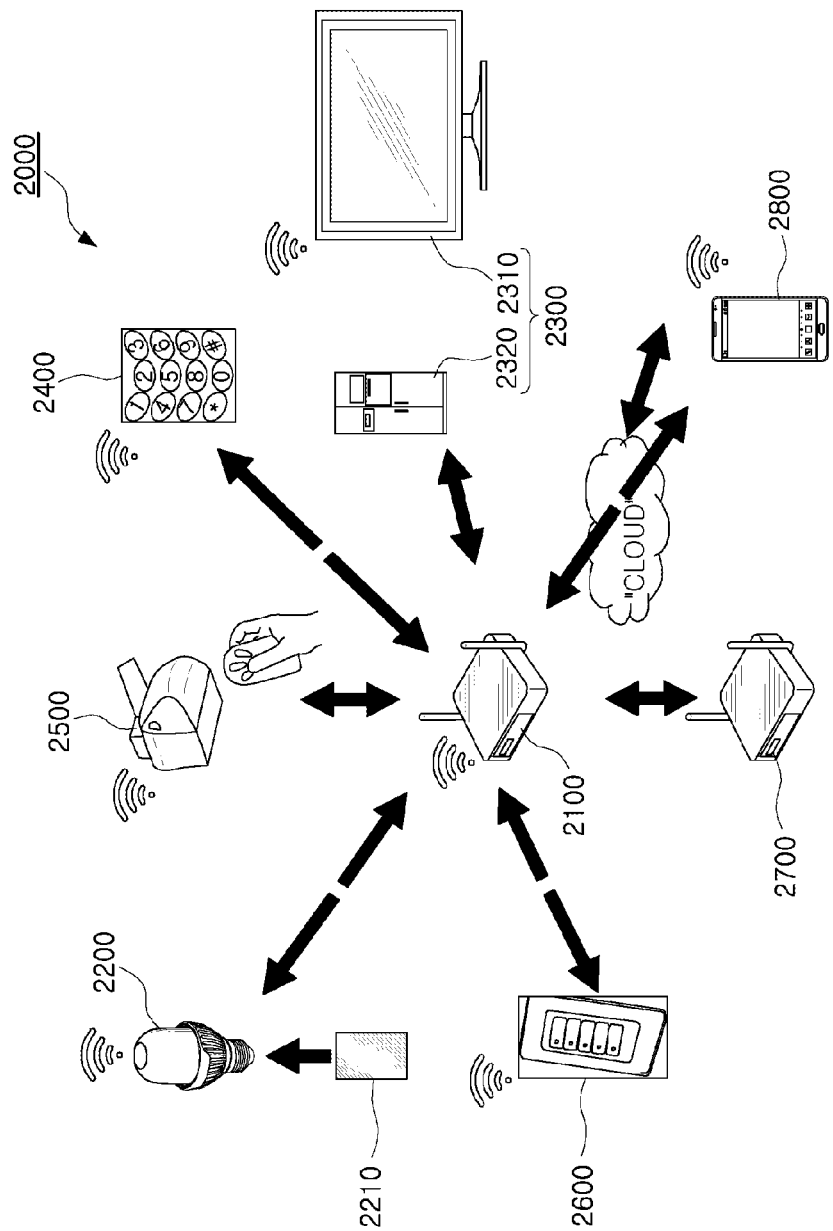
FIG. 18 is a view of an indoor lighting control network system in which a light source module according to some example embodiments of the inventive concepts may be employed.

FIG. 18 is a view of an indoor lighting control network system in which a light source module according to some example embodiments of the inventive concepts may be employed.

A network system 2000 according to some example embodiments may be a complex smart lighting-network system in which lighting technology, Internet of Things (IoT) technology, wireless communications technology, and the like using a semiconductor light emitting device, such as an LED, converge. The network system 2000 may be implemented using various types of lighting devices and wired and wireless communications devices, and may be realized by a sensor, a controller, a communications unit, software for network control and maintenance, and the like.

The network system 2000 may be applied to an open space such as a park or a street, as well as to a closed space defined within a building such as a home or an office. The network system 2000 may be implemented on the basis of an IoT environment to collect and process various pieces of information and provide the collected and processed information to a user. In this case, an LED lamp 2200 included in the network system 2000 may include the light source module 100 illustrated in FIG. 1. The LED lamp 2200 may function to check and control operational states of other devices 2300 to 2800 included in the IoT environment on the basis of a function of the LED lamp 2200 such as visible light communications, as well as to receive information regarding surroundings from a gateway 2100 to control lighting of the LED lamp 2200 itself.

Referring to FIG. 18, the network system 2000 may include the gateway 2100 processing data transmitted and received over different communications protocols, the LED lamp 2200 connected to the gateway 2100 to communicate therewith and including an LED as a light source, and the plurality of devices 2300 to 2800 connected to the gateway 2100 to communicate therewith according to various wireless communications schemes. To implement the network system 2000 on the basis of the IoT environment, the LED lamp 2200 and the respective devices 2300 to 2800 may include at least one communications module. In some example embodiments, the LED lamp 2200 may be connected to the gateway 2100 to communicate therewith over wireless communications protocols such as Wi-Fi, Zigbee®, and light fidelity (Li-Fi), and to this end, the LED lamp 2200 may have at least one lamp communications module 2210.

As described above, the network system 2000 may be applied to an open space such as a park or a street, as well as to a closed space such as a home or an office. When the network system 2000 is applied to a home, the plurality of devices 2300 to 2800 included in the network system 2000 and connected to the gateway 2100 to communicate therewith on the basis of IoT technology may include home appliances 2300, a digital door lock 2400, a garage door lock 2500, a lighting switch 2600 installed on a wall or the like, a router 2700 for wireless network relay, and a mobile device 2800 such as a smartphone, a tablet PC, or a laptop PC.

In the network system 2000, the LED lamp 2200 may check the operating states of the various devices 2300 to 2800, or may automatically control luminance of the LED lamp 2200 itself according to the devices' surroundings and circumstances, using wireless communications networks (Zigbee®, Wi-Fi, Li-Fi, and the like) installed in a home. Use of Li-Fi communications using visible light emitted by the LED lamp 2200 may allow the devices 2300 to 2800 included in the network system 2000 to be controlled.

First, the LED lamp 2200 may automatically control the luminance of the LED lamp 2200 on the basis of information regarding surroundings transmitted from the gateway 2100 through the lamp communications module 2210, or information regarding circumstances collected by a sensor mounted in the LED lamp 2200. For example, brightness of the LED lamp 2200 may be automatically controlled according to a type of a program being broadcast on the television 2310 or brightness of an image. To this end, the LED lamp 2200 may receive operational information of the television 2310 from the lamp communications module 2210 connected to the gateway 2100. The lamp communications module 2210 may be integrally modularized with a sensor and/or a controller included in the LED lamp 2200.

For example, in a case in which a program broadcast on the television 2310 is a drama, a color temperature of illumination may be controlled to be less than or equal to 12,000K such as 6,000K according to desired (and/or alternatively predetermined) settings to control colors, thereby creating a cozy atmosphere. In a different manner, when a program is a comedy, the network system 2000 may be configured in such a manner that a color temperature of illumination may be increased to 6,000K or more and to be blue-based white lighting according to desired (and/or alternatively predetermined) settings.

When a certain period of time has elapsed after the digital door lock 2400 is locked while there is no person in a home, the network system 2000 may allow all LED lamps 2200 turned on to be turned off, thereby reducing and/or preventing a waste of electricity. Alternatively, when a security mode is set by the mobile device 2800 or the like, if the digital door lock 2400 is locked while there is no person in a home, the network system 2000 may allow the LED lamps 2200 to remain turned on.

Operations of the LED lamp 2200 may also be controlled according to information regarding circumstances collected by various types of sensors connected to the network system 2000. For example, when the network system 2000 is implemented within a building, a light, a position sensor, and a communications module may be combined with each other in the building to collect information on locations of people in the building so that the light may be turned on or off, or the collected information may be provided to a user in real time, thereby enabling facility management or efficient use of an idle space. In general, since a lighting device such as the LED lamp 2200 is disposed in almost all of the spaces on each floor of a building, various pieces of information in the building may be collected by a sensor integrated with the LED lamp 2200, and the collected information may be used to manage facilities or utilize an idle space.

Meanwhile, a combination of the LED lamp 2200 with an image sensor, a storage device, the lamp communications module 2210, and the like may allow the LED lamp 2200 to be utilized as a device that may maintain building security or detect and deal with an emergency. For example, when a smoke or temperature sensor is attached to the LED lamp 2200, the LED lamp 2200 may quickly detect whether a fire or the like occurs, thereby significantly reducing damage to the building, and may also control brightness of lighting considering external weather or an amount of sunshine, thereby saving energy and providing a comfortable lighting environment.

Figure 19:
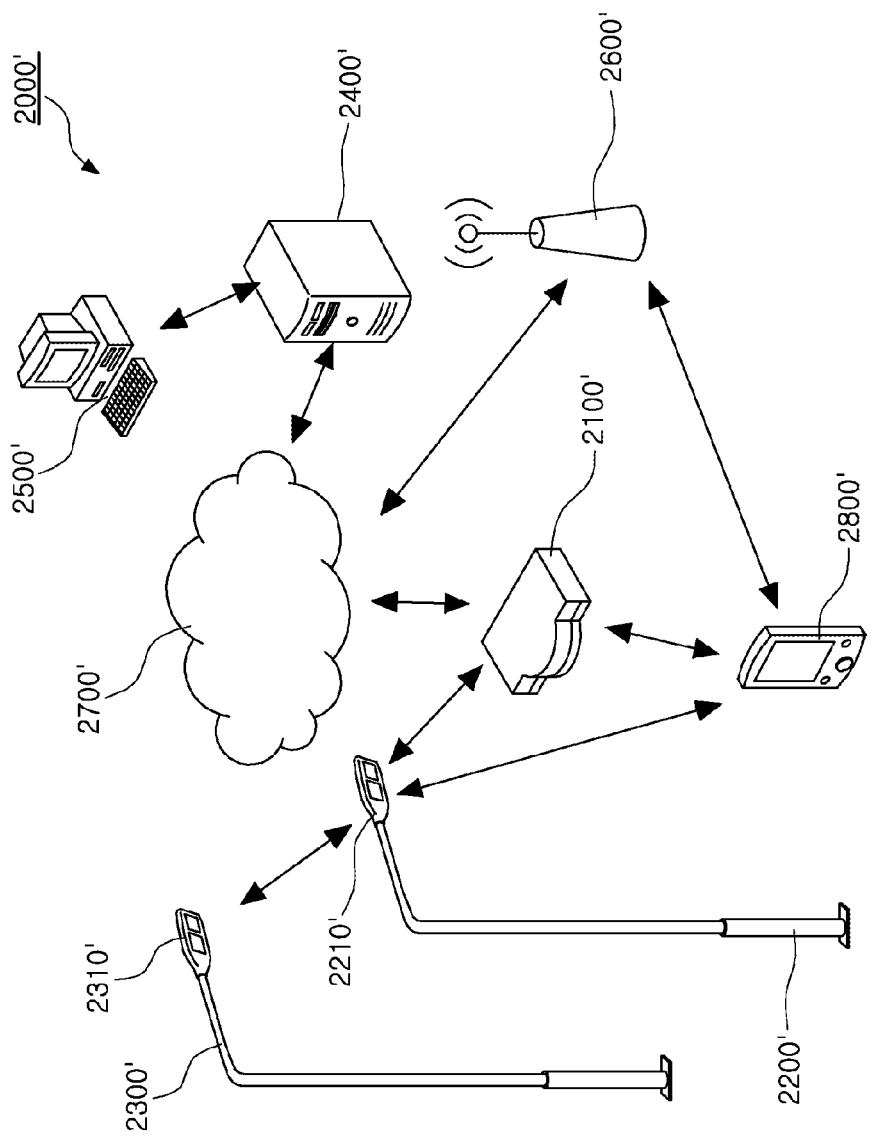
FIG. 19 is a view of an open network system in which a light source module according to some example embodiments of the inventive concepts may be employed.

FIG. 19 is a view of an open network system in which alight source module according to some example embodiments of the inventive concepts may be employed.

Referring to FIG. 19, a network system 2000' according to some example embodiments may include a communications connection device 2100', a plurality of lighting fixtures 2200' and 2300' installed at desired (and/or alternatively predetermined) intervals and connected to the communications connection device 2100' to communicate therewith, a server 2400', a computer 2500' managing the server 2400', a communications base station 2600', a communications network 2700' connecting the above-mentioned communicable devices, a mobile device 2800', and the like.

The plurality of lighting fixtures 2200' and 2300' installed in an external open space such as a street or a park may include smart engines 2210' and 2310', respectively, along with the light source module 100 illustrated in FIG. 1. Each of the smart engines 2210' and 2310' may include a sensor collecting information regarding surroundings, a communications module, and the like, in addition to a semiconductor light emitting device emitting light and a driver driving the semiconductor light emitting device. The communications module may allow the smart engines 2210' and 2310' to communicate with other surrounding devices over communications protocols such as Wi-Fi, Zigbee®, and Li-Fi.

As an example, one smart engine 2210' may be connected to the other smart engine 2310' to communicate therewith. In this case, Wi-Fi extension technology (Wi-Fi mesh) may be applied to communications between the smart engines 2210' and 2310'. At least one smart engine 2210' may be connected to the communications connection device 2100' linked to the communications network 2700' through wired and wireless communications. To increase communications efficiency, several smart engines 2210' and 2310' may be grouped into one to be connected to a single communications connection device 2100'.

The communications connection device 2100' may relay communications between the communications network 2700' and other devices, as an access point (AP) that may enable wired and wireless communications. The communications connection device 2100' may be connected to the communications network 2700' by at least one wired and wireless communications method, and may be mechanically accommodated in one of the lighting fixtures 2200' and 2300' as an example.

The communications connection device 2100' may be connected to the mobile device 2800' through a communications protocol such as Wi-Fi. A user of the mobile device 2800' may receive information regarding surroundings collected by the plurality of smart engines 2210' and 2310' through the communications connection device 2100' connected to the smart engine 2210' of an adjacent surrounding lighting fixture 2200'. The information regarding the surroundings may include surrounding traffic information, weather information, and the like. The mobile device 2800' may be connected to the communications network 2700' in a wireless cellular communications method such as 3G or 4G through the communications base station 2600'.

Meanwhile, the server 2400' connected to the communications network 2700' may monitor operating states or the like of the respective lighting fixtures 2200' and 2300' while receiving information collected by the smart engines 2210' and 2310' respectively mounted in the lighting fixtures 2200' and 2300'. To manage the respective lighting fixtures 2200' and 2300' on the basis of the monitoring results of the operating states of the respective lighting fixtures 2200' and 2300', the server 2400' may be connected to the computer 2500' providing a management system. The computer 2500' may execute software or the like able to monitor and manage operating states of the respective lighting fixtures 2200' and 2300', particularly the smart engines 2210' and 2310'.

As set forth above, according to example embodiments of the inventive concepts, at least one alignment component having a convex or concave shape may be disposed on a chip mounting region of a circuit board, thereby precisely and quickly aligning an LED chip in a process of mounting the LED chip. A magnetic body may be applied to at least one of an LED chip and a circuit board, thereby increasing a self-alignment effect.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A light source module, comprising:
a circuit board including at least one chip mounting region, the at least one chip mounting region including at least one connection pad;
at least one alignment component on the at least one chip mounting region, the at least one alignment component including a convex shape; and
at least one light emitting diode (LED) chip on the at least one chip mounting region, the at least one LED chip including at least one electrode, the at least one electrode configured to be electrically connected to the at least one connection pad of the at least one chip mounting region, the at least one LED chip being coupled to at least one alignment component of the at least one chip mounting region, the at least one LED chip includes at least one alignment recess, the at least one alignment recess being configured to be coupled to the at least one alignment component of the at least one chip mounting region.

2. The light source module of claim 1, wherein alignment components are on respective edges of the at least one chip mounting region.

3. The light source module of claim 1, wherein,
the at least one LED chip includes,
 a light transmitting substrate, and
 a semiconductor stack on the light transmitting substrate, and
the at least one alignment recess extends from points on edges of the light transmitting substrate of the at least one LED chip to points on edges of the light transmitting substrate of the at least one LED chip adjacent thereto in the semiconductor stack of the at least one LED chip.

4. The light source module of claim 1, wherein the at least one LED chip further includes at least one alignment pad on the at least one alignment recess.

5. The light source module of claim 4, wherein at least one of the at least one alignment component and the at least one alignment pad includes a magnetic body.

6. The light source module of claim 1, wherein at least one of the at least one connection pad and the at least one electrode includes a magnetic body.

7. The light source module of claim 1, further comprising:
a reflective guide layer on the circuit board and surrounding the at least one LED chip.

8. A light emitting diode (LED) display panel, comprising:
a circuit board including a plurality of pixel regions, each pixel region of the plurality of pixel regions including a plurality of chip mounting regions, each chip mounting region of the plurality of chip mounting regions including at least one connection pad;
at least one alignment component on each chip mounting region of the plurality of chip mounting regions, the at least one alignment component including a convex shape or a concave shape; and
a plurality of LED chips on the plurality of chip mounting regions, respectively, each LED chip of the plurality of LED chips including,
 at least one electrode configured to be electrically connected to the at least one connection pad of each chip mounting region of the plurality of chip mounting regions, and
 an alignment structure configured to be coupled to the at least one alignment component of each chip mounting region of the plurality of chip mounting regions.

9. The LED display panel of claim 8, wherein,
the at least one alignment component on each chip mounting region of the plurality of chip mounting regions includes at least one alignment post structure on at least one edge of the chip mounting region of the plurality of chip mounting regions, and
each LED chip of the plurality of LED chips includes at least one alignment recess configured to be coupled to at least one alignment post structure of the plurality of chip mounting regions, respectively.

10. The LED display panel of claim 9, wherein,
each LED chip of the plurality of LED chips includes,
 a light transmitting substrate, and
 a semiconductor stack on the light transmitting substrate, and
the at least one alignment recess extends from points on edges of the light transmitting substrate of the LED chip of the plurality of LED chips to points on edges of the light transmitting substrate of an adjacent LED chip of the plurality of LED chips in the semiconductor stack of the LED chip of the plurality of LED chips.

11. The LED display panel of claim 9, wherein,
each LED chip of the plurality of LED chips further includes at least one alignment pad on the at least one alignment recess, and
at least one alignment component on each chip mounting region of the plurality of chip mounting regions and the at least one alignment pad of each LED chip of the plurality of LED chips includes a magnetic body.

12. The LED display panel of claim 8, wherein at least one element of the at least one connection pad and the at least one electrode includes a magnetic body.

13. The LED display panel of claim 8, wherein the at least one electrode includes at least one conductive magnetic body layer.

14. The LED display panel of claim 8, wherein,
the each LED chip of the plurality of LED chips includes a first surface, and each LED chip of the plurality of LED chips is configured to be on the circuit board such that the first surface of the LED chip of the plurality of LED chips is a proximate surface of the LED chip of the plurality of LED chips, relative to the circuit board;
the at least one connection pad includes a first connection pad and a second connection pad;
the at least one electrode is on the first surface; and
the at least one electrode includes a first electrode and a second electrode, the first electrode and the second electrode being configured to be connected to the first connection pad and the second connection pad, respectively.

15. The LED display panel of claim 8, wherein,
the each LED chip of the plurality of LED chips includes a first surface, and each LED chip of the plurality of LED chips is configured to be on the circuit board such that the first surface of the LED chip of the plurality of LED chips is a proximate surface of the LED chip of the plurality of LED chips, relative to the circuit board;
each LED chip of the plurality of LED chips includes a second surface, the second surface being an opposing surface, relative to the first surface;
the at least one electrode includes a first electrode on the first surface; and each LED chip of the plurality of LED chips further includes a second electrode, the second electrode being on the second surface.

16. The LED display panel of claim 15, further comprising:
an electrode wiring layer configured to interconnect second electrodes of each LED chip of the plurality of LED chips.

17. A light emitting diode (LED) chip, comprising:
a light transmitting substrate;
a semiconductor stack on the light transmitting substrate; and
at least one electrode on at least a portion of the semiconductor stack, the at least one electrode configured to couple with at least one connection pad of a circuit board to form a complementary fit, the circuit board being separate from the LED chip, such that
a sidewall of the at least one electrode is in flush contact with a sidewall of the at least one connection pad, and
at least a portion of the at least one electrode is co-planar with at least one portion of the at least one connection pad.

18. The LED chip of claim 17, wherein the at least one electrode includes a magnetic body.

19. The LED chip of claim 17, wherein the at least one electrode includes at least one conductive magnetic body layer.

* * * * *

UNITED STATES PATENT AND TRADEMARK OFFICE
CERTIFICATE OF CORRECTION

PATENT NO. : 9,825,014 B2
APPLICATION NO. : 15/226209
DATED : November 21, 2017
INVENTOR(S) : Nam Goo Cha et al.

It is certified that error appears in the above-identified patent and that said Letters Patent is hereby corrected as shown below:

On the Title Page

(72) Inventors should read:
Nam Goo Cha, Hwaseong-si (KR);
Yong Il Kim, Seoul (KR);
Wan tae Lim, Suwon-si (KR)

Signed and Sealed this
Twenty-eighth Day of May, 2019

Andrei Iancu
*Director of the United States Patent and Trademark Office*